(12) United States Patent
Hino et al.

(10) Patent No.: US 7,262,507 B2
(45) Date of Patent: Aug. 28, 2007

(54) SEMICONDUCTOR-MOUNTED DEVICE AND METHOD FOR PRODUCING SAME

(75) Inventors: Shigekazu Hino, Ohtsu (JP); Takashi Magoi, Ohtsu (JP); Syunichi Iwanaga, Ohtsu (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/020,132

(22) Filed: Dec. 27, 2004

(65) Prior Publication Data

US 2005/0146026 A1   Jul. 7, 2005

(30) Foreign Application Priority Data

Dec. 26, 2003  (JP) .............................. 2003-431784
Dec. 26, 2003  (JP) .............................. 2003-433028

(51) Int. Cl.
*H01L 23/48* (2006.01)
*H01L 23/52* (2006.01)
*H01L 29/40* (2006.01)

(52) U.S. Cl. ...................... 257/777; 257/773; 257/776; 257/778; 257/788; 257/789; 257/793; 257/E21.502; 257/E21.503; 257/177; 257/178

(58) Field of Classification Search ................ 257/685, 257/686, 723, 777
See application file for complete search history.

(56) References Cited

U.S. PATENT DOCUMENTS 5,900,312 A * 5/1999 Sylvester ................ 428/322.7
6,229,215 B1 * 5/2001 Egawa ........................ 257/777
6,239,496 B1 * 5/2001 Asada .......................... 257/777
6,798,044 B2 * 9/2004 Joshi ........................... 257/666
2002/0030261 A1 * 3/2002 Rolda et al. ................ 257/685
2004/0140538 A1 * 7/2004 Harvey ....................... 257/666
2004/0159955 A1 * 8/2004 Shen ........................... 257/777

FOREIGN PATENT DOCUMENTS

JP        2634351        4/1993

* cited by examiner

*Primary Examiner*—Jasmine Clark
(74) *Attorney, Agent, or Firm*—Young & Thompson

(57) ABSTRACT

Semiconductor-mounted device comprises wired board, first semiconductor chip mounted on first side of wired board, second semiconductor chip mounted on second side of wired board and sealing resin sealing, with a same height, a region disposed at and around first semiconductor chip and opposite, across wired board, to at least an area of projecting electrodes of second semiconductor chip; and a producing method thereof. Semiconductor-mounted device also comprises wired board, first semiconductor chip mounted on first side of wired board, second semiconductor chip mounted on second side of wired board and resin sheet covering, at substantially a same height as first semiconductor chip, a region disposed around first semiconductor chip and opposite, across wired board, to at least an area of projecting electrodes of second semiconductor chip, back surface of first semiconductor chip being exposed; and a producing method thereof.

34 Claims, 10 Drawing Sheets

PRIOR ART

SEMICONDUCTOR-MOUNTED DEVICE AND METHOD FOR PRODUCING SAME

FIELD OF THE INVENTION

The present invention relates to a semiconductor-mounted device mounted semiconductor chips on both sides of a wired board and a producing method thereof, particularly, a semiconductor-mounted device in which a semiconductor chip of a front side of a wired board is not aligned with a semiconductor chip of a back side of a wired board and a producing method thereof.

BACKGROUND OF THE INVENTION

In order to meet a requirement for miniaturizing and thinning an electronic device, a method has been adopted that finely miniaturizes a semiconductor chip pattern, and that mounts semiconductor chips on both sides of a wired board, thereby increasing a mounting efficiency.

An example of a semiconductor-mounted device mounted with semiconductor chips on both sides of a wired board is shown in FIG. 10. Electrode pads (not shown) of a wired board 2 and projecting electrodes 4 of a semiconductor chip 3 are electrically and mechanically connected at opposite positions of both sides of the semiconductor-mounted device 8, the wired board 2 and the semiconductor chip 3 being adhered by underfill resin 5.

A method for producing the semiconductor-mounted device is shown in FIGS. 11(a)-(c). As shown in FIG. 11(a), first of all the wired board 2 is put on a stage 6 with a heating apparatus (not shown), the electrode pads (not shown) on the wired board 2 and the corresponding projecting electrodes 4 of the semiconductor chip 3 being put together and connected by applying heat and pressure. As shown in FIG. 11(b), the underfill resin 5 is then introduced between the wired board 2 and the semiconductor chip 3, the wired board 2 and the semiconductor chip 3 being adhered by heat-hardening. Alternatively, the underfill resin 5 may be applied on the wired board 2 or the semiconductor chip 3 before the connection of the projecting electrodes 4 explained in FIG. 11(a) and then be simultaneously heat-hardened when the projecting electrodes 4 are connected. As shown in FIG. 11(c), the wired board 2 is then turned over, put on the stage 6 and provided with another semiconductor chip opposite to the semiconductor chip mounted on the other side of the wired board 2 in the same way as above.

In the above-mentioned semiconductor-mounted device and the producing method thereof, however, the positions at which the semiconductor chips are mounted on the both sides of the wired board have to be opposing each other across the wired board because it is necessary that pressure is applied to connect the electrode pad of the wired board and the projecting electrode of the semiconductor chip. When the positions are not opposing each other across the wired board, the wired board 2 warps on applying pressure on the semiconductor chip 3 as shown in FIG. 12, so the projecting electrode 4 can not contact with the electrode pad (not shown) of the wired board 2, thereby causing an open defect.

Therefore, it has been necessary to mount the semiconductor chips with almost the same size on the positions opposing each other across the wired board. This has largely restricted the constitution of the semiconductor-mounted device.

On the other hand, in Japanese Patent Gazette of Patent No. 2634351 (Pages 2-4, FIG. 1), a method is disclosed in which surface mount ICs that are not necessary to apply pressure for its mounting are mounted on positions not-opposing each other across a wired board, as shown in FIG. 13.

DISCLOSURE OF THE INVENTION

The above-mentioned method which uses the surface mount IC can avoid the restriction of the constitution of the semiconductor-mounted device. However, there are problems that the size and thickness become larger as compared with the semiconductor chip per se, and that the packaging is costly.

According to a first aspect of the present invention, it is an object to provide a semiconductor-mounted device in which semiconductor chips can be mounted on any position of both sides of a wired board, and in which an open defect does not occur, and a producing method thereof.

In a solution described below for solving the object in the first aspect of the present invention, however, there are the following drawbacks. The costs become greater because the wired board has to be transferred from a stage to a sealing mold, be sealed, and be placed on the stage again, and because an expensive sealing mold is necessary. There is also probability that repetition of generating heat and cooling during working of the semiconductor chip generates a problem of reliance such as connection defect of projecting electrodes and cracks or peeling of a sealing resin because the sealing resin whose thermal expansion coefficient is largely different from that of the wired board or semiconductor chip forms an asymmetric constitution. There is further probability that the semiconductor-mounted device interferes with other electronic devices because a first side of the wired board is covered with the sealing resin, thereby reducing an effective space for further mounting of the semiconductor-mounted device.

It is an object of the present invention in a second aspect to provide a semiconductor-mounted device in which positions of mounting semiconductor chips are different between both sides of a wired board, and a producing method thereof; it does not largely increases the costs as compared with the solution of the first aspect, does not generate any problem of the reliance such as the bad connection of the projecting electrodes and the cracks or peeling of the sealing resin, and does not reduce the space around the semiconductor-mounted device.

According to the first aspect of the present invention, there is provided a first semiconductor-mounted device that comprises: a wired board; a first semiconductor chip and a second semiconductor chip mounted on both sides of the wired board; and a sealing resin sealing, with a same height, a region disposed at and around the first semiconductor chip mounted on a first side of the wired board and opposite, across the wired board, to at least an area of projecting electrodes of the second semiconductor chip mounted on a second side of the wired board.

According to the first aspect of the present invention, there is provided a second semiconductor-mounted device that comprises: a wired board; a first semiconductor chip and a second semiconductor chip mounted on both sides of the wired board; and a sealing resin sealing, with a same height, a region disposed at and around a first semiconductor chip mounted on a first side of the wired board and opposite, across the wired board, to at least an area of the second semiconductor chip mounted on a second side of the wired board.

According to the first aspect of the present invention, there is provided a first method for producing a semiconductor-mounted device. The method comprises the steps of: providing a wired board; mounting a first semiconductor chip on a first side of the wired board; sealing with a resin, at same height, a region disposed at and around the first semiconductor chip and opposite, across the wired board, to at least an area of projecting electrodes of a second semiconductor chip to be mounted on a second side of the wired board; and mounting the second semiconductor chip on the second side of the wired board.

According to the first aspect of the present invention, there is provided a second method for producing a semiconductor-mounted device. The method comprises the steps of: providing a wired board; mounting a first semiconductor chip on a first side of the wired board; sealing with a resin, at the same height, a region disposed at and around the first semiconductor chip and opposite, across the wired board, to at least an area of a second semiconductor chip to be mounted on a second side; and mounting the second semiconductor chip on the second side of the wired board.

According to a second aspect of the present invention, there is provided a third semiconductor-mounted device. The device comprises: a wired board; a first semiconductor chip and a second semiconductor chip mounted on both sides of the wired board; and a resin sheet covering, at substantially a same height as the first semiconductor chip, a region disposed around the first semiconductor chip mounted on a first side of the wired board and opposite, across the wired board, to at least an area of projecting electrodes of the second semiconductor chip mounted on a second side of the wired board; wherein the back surface of the first semiconductor chip is exposed.

According to the second aspect of the present invention, there is provided a fourth semiconductor-mounted device. The device comprises: a wired board; a first semiconductor chip and a semiconductor chip mounted on both sides of the wired board; and a resin sheet covering, at substantially a same height as the first semiconductor chip, a region disposed around the first semiconductor chip mounted on a first side of the wired board and opposite, across the wired board, to at least an area of the second semiconductor chip mounted on a second side of the wired board; wherein the back surface of the first semiconductor chip is exposed.

According to the second aspect of the present invention, there is provided a third method for producing a semiconductor-mounted device that comprises the steps of: providing a wired board having a first side and a second side; mounting a first semiconductor chip on the first side of the wired board; covering a region with a resin sheet at substantially a same height as the first semiconductor chip so as to expose the back surface of the first semiconductor, the region being disposed around the first semiconductor chip and opposite, across the wired board, to at least an area of projecting electrodes of a second semiconductor chip to be mounted on the second side; and mounting the second semiconductor chip on the second side.

According to the second aspect of the present invention, there is provided a fourth method for producing a semiconductor-mounted device that comprises the steps of: providing a wired board having a first side and a second side; mounting a first semiconductor chip on the first side of the wired board; covering a region with a resin sheet at substantially a same height as the first semiconductor chip so as to expose the back surface of the first semiconductor, the region being disposed around the first semiconductor chip and opposite, across the wired board, to at least an area of a second semiconductor chip to be mounted on the second side; and mounting the second semiconductor chip on the second side.

The semiconductor-mounted device and the producing method thereof in the first aspect of the present invention can achieve a good industrial effect that a semiconductor-mounted device can be provided in which semiconductor chips can be mounted on any positions of both sides of a wired board freed of the open defect.

In the first aspect of the present invention, as shown in FIG. 1, a semiconductor-mounted device 8 comprises a sealing resin 1 covering, with a same height, a region disposed at and around a first semiconductor chip 3$a$ mounted on a first side of a wired board and opposite, across the wired board 2, to at least an area of projecting electrodes 4 of a second semiconductor chip 3$b$ mounted on a second side of the wired board, and a producing method thereof. Therefore, when heat and pressure are applied to the second semiconductor chip 3$b$, the wired board 2 just under the projecting electrodes 4 of the second semiconductor chip 3$b$ is supported by the sealing resin 1, so the heat and pressure do not generate any warp, the electrode pads of the wired board 2 and the projecting electrodes 4 being securely connected, thereby freed from generation of open defect. The region sealed with the resin at the side of the first semiconductor chip 3$a$ can be also modified at any time corresponding to the position at which the second semiconductor chip 3$b$ is mounted, so that the position of the second semiconductor chip 3$b$ can be arbitrarily selected and thus restrictions of the constitution of the semiconductor-mounted device can be eliminated.

The semiconductor-mounted devices and the producing methods thereof in the second aspect of the present invention can achieve a good industrial effect that a semiconductor-mounted device can be provided in which positions at which semiconductor chips are mounted can be different from one side to the other side of a wired board; the semiconductor-mounted device does not largely increase its costs as compared with the above-mentioned method of the resin seal, further freed from the problems of reliance such as connection error of projecting electrodes and cracks or peeling of the sealing resin, and does not largely reduce the space around the semiconductor-mounted device.

DETAILED DESCRIPTION OF THE PREFERRED EMBODIMENT

Embodiments of the present invention will be explained below referring to the attached drawings, in which the symbols coincide with ones of the same matter as the conventional art.

Figure 1:
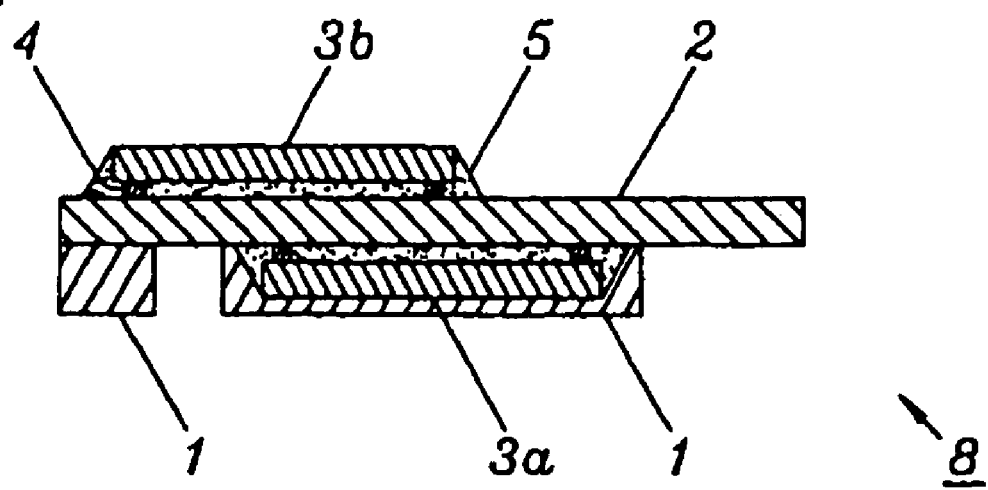
FIG. 1 is a cross sectional view showing an embodiment of a semiconductor-mounted device according to a first aspect of the present invention.

According to a first aspect of the present invention, as shown in FIG. 1, in a semiconductor-mounted device of an embodiment of the present invention, electrode pads (not shown) of a wired board 2 and projecting electrodes 4 of semiconductor chips 3*a*, 3*b* are electrically and mechanically connected on both sides of the wired board 2, the wired board 2 and the semiconductor chips 3*a*, 3*b* being adhered by an underfill resin 5. The semiconductor-mounted device 8 of the present invention comprises a sealing resin 1 which seals a region disposed at and around the first semiconductor chip 3*a* mounted on the first side of the wired board and at the position opposite, across the wired board, to at least an area of the projecting electrodes 4 of the second semiconductor chip 3*b* mounted on the second side of the wired board.

Figure 2:
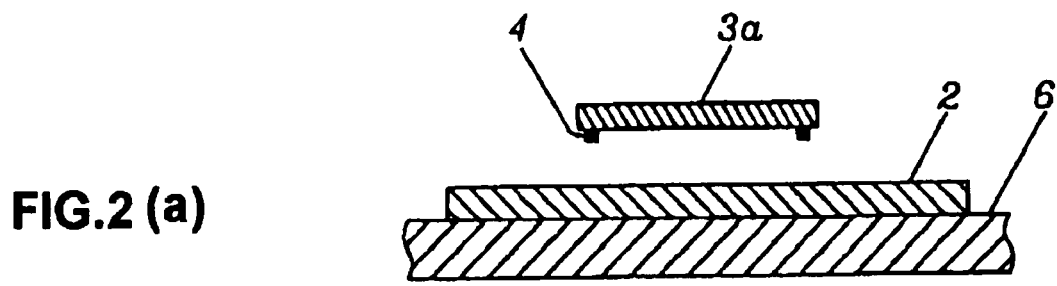
FIGS. 2($a$)-($e$) are cross sectional views showing a method for producing a semiconductor-mounted device according to a first aspect of the present invention.
Figure 2:
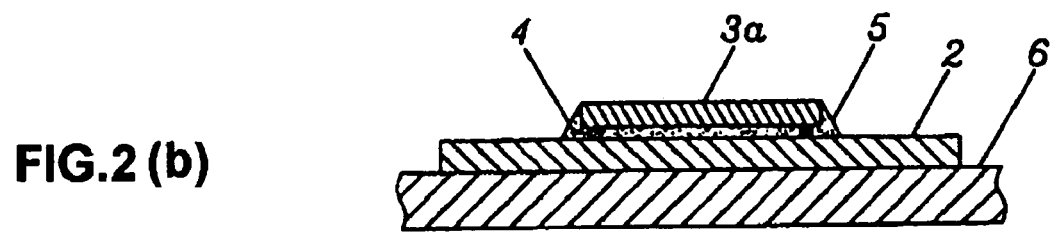
Figure 2:
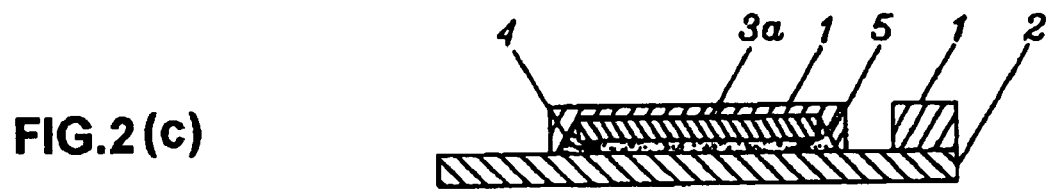
Figure 2:
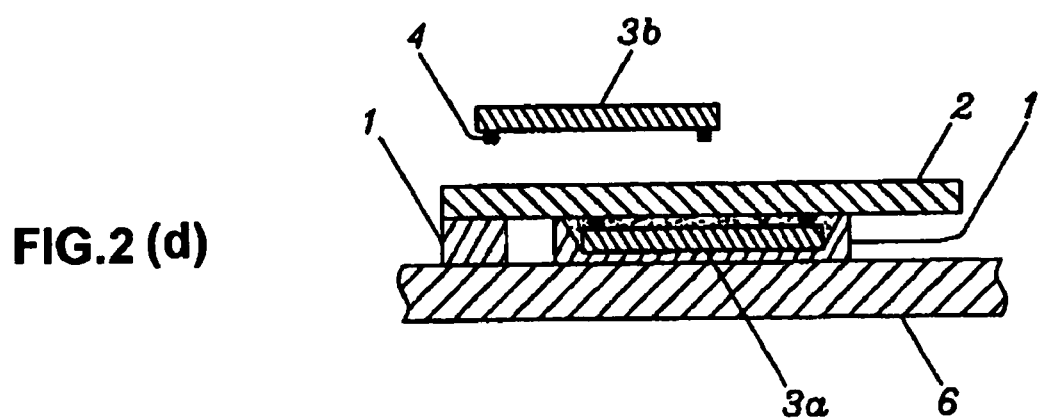
Figure 2:
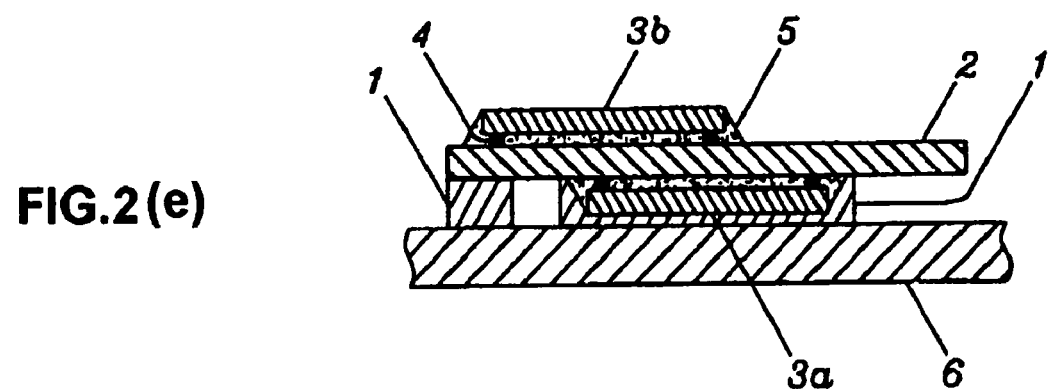
Figure 11A:
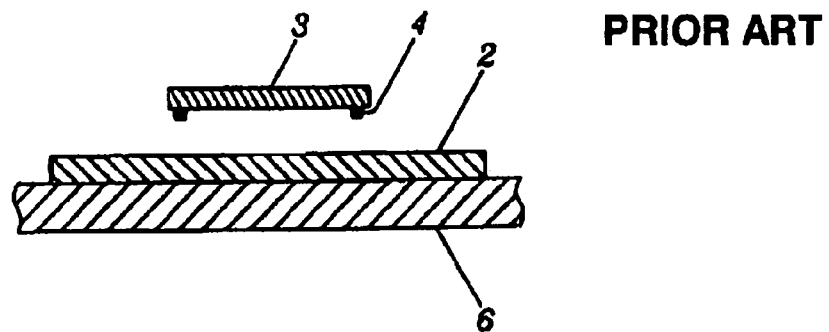
FIGS. 11(*a*)-(*c*) are cross sectional views showing a method for producing a conventional semiconductor-mounted device.
Figure 11B:
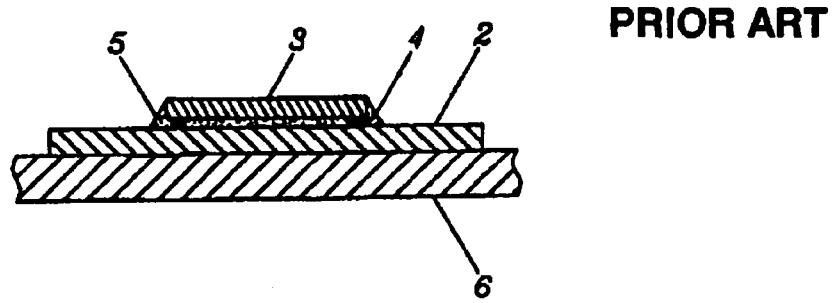
Figure 11C:
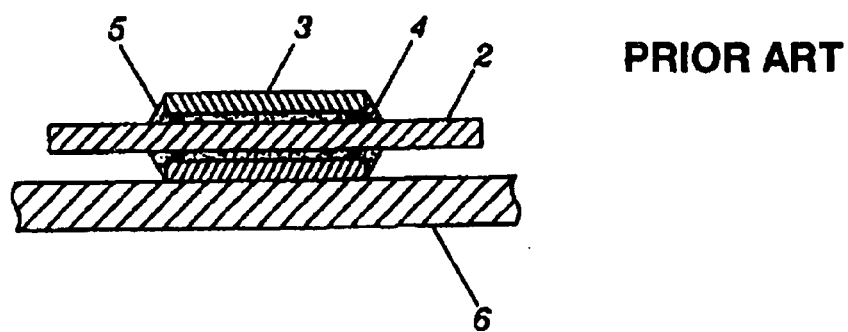
Figure 12:
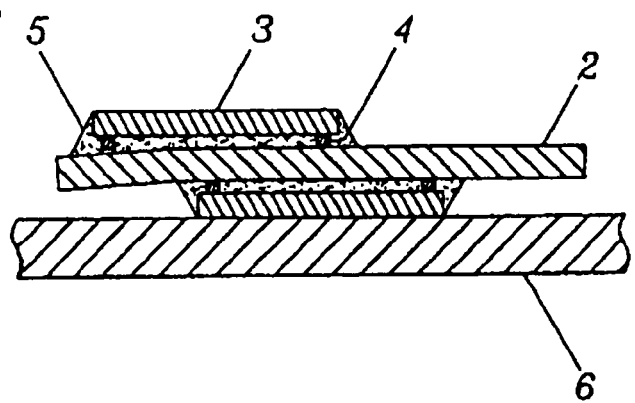
FIG. 12 is a cross sectional view to explain a problem of a conventional semiconductor-mounted device.
Figure 13:
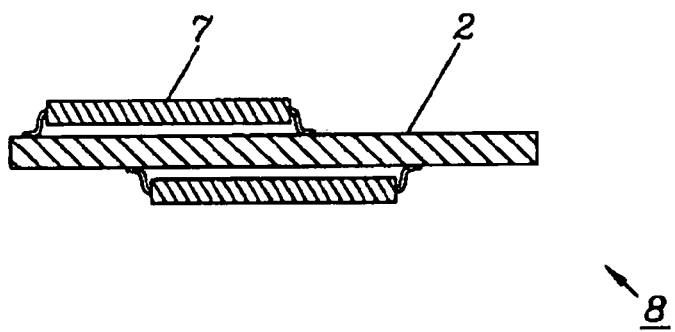
FIG. 13 is a cross sectional view showing an embodiment of another conventional semiconductor-mounted device.

According to the first aspect of the present invention, a method for producing a semiconductor-mounted device of an embodiment of the present invention may be identical with the method explained via FIGS. 11(*a*)-(*b*) in the section of BACKGROUND OF THE INVENTION, until the projecting electrodes 4 of the first semiconductor chip 3*a* are put on the electrode pads (not shown) of the first side of the wired board 2 and connected by applying heat and pressure, as shown in FIGS. 2(*a*)-(*b*). As shown in FIG. 2(*c*), the method for producing the semiconductor-mounted device of the present invention further comprises the step of sealing a region by a sealing resin 1, the region being disposed at and around the first semiconductor chip 3*a* and opposite, across the wired board, to at least the area of the projecting electrodes 4 of the second semiconductor chip 3*b* to be mounted on the second side of the wired board. As shown in FIGS. 2(*d*)-(*e*), the wired board 2 is then turned over and placed on a stage 6, the second semiconductor chip 3*b* being mounted on the second side of the wired board 2 by using the known art.

In this case, the part of the wired board 2 disposed just beneath the projection electrodes 4 of the second semiconductor chip 3*b* is supported by the sealing resin 1, so heat and pressure does not generate any warp, the electrode pads of the wired board 2 and the projecting electrodes 4 being securely connected, thereby being freed from any open defect. The region of the resin seal at the side of the first semiconductor chip 3*a* can be also modified and adjusted at any time corresponding to the position at which the second semiconductor chip 3*b* is mounted, so that the position of the second semiconductor chip 3*b* can be arbitrarily selected and that the restriction in the constitution of the semiconductor-mounted device can be eliminated.

Figure 3:
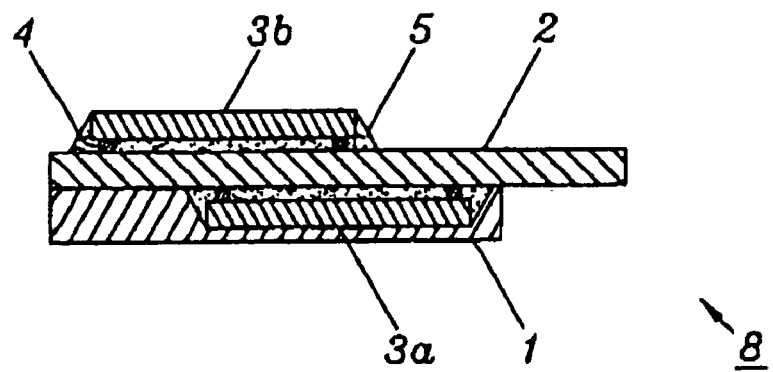
FIG. 3 is a cross sectional view showing another embodiment of a semiconductor-mounted device according to a first aspect of the present invention.

According to another embodiment of the first aspect of the present invention, as shown in FIG. 3, a whole region disposed at and around the first semiconductor chip 3*a* and at the position opposite, across the wired board, to at least the area of the second semiconductor chip 3*b* mounted on the second side of the wired board may be sealed with the resin. Therefore, the structure of a mold for the resin seal can be simplified.

Figure 4:
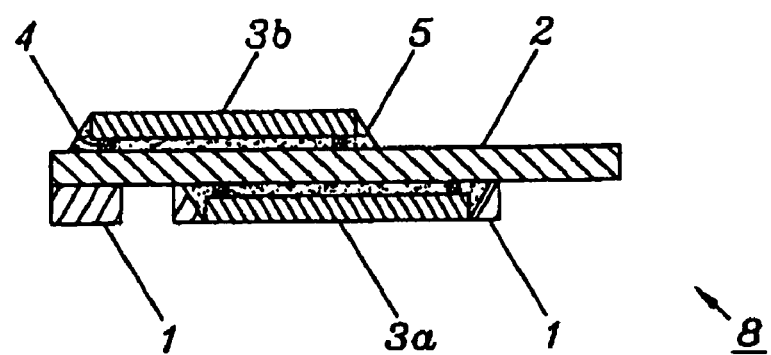
FIGS. 4($a$)-($b$) are cross sectional views showing further embodiments of a semiconductor-mounted device according to a first aspect of the present invention.
Figure 4:
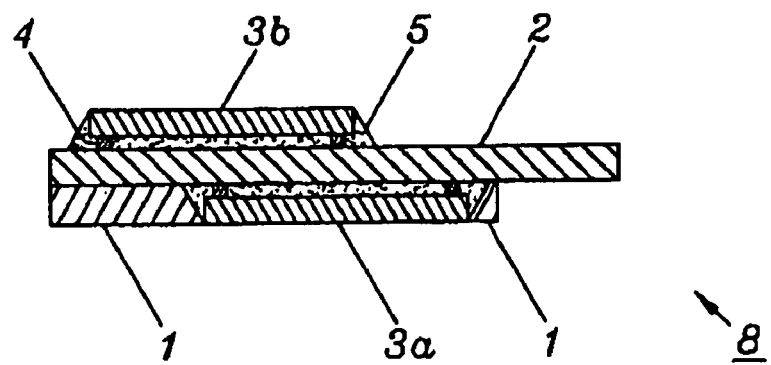

According to a further embodiment of the first aspect of the present invention, as shown in FIGS. 4(*a*)-(*b*), the sealing resin may have the same height as the semiconductor chip, and the resin seal may be performed so as to expose the back surface of the semiconductor chip out of the sealing resin. Therefore, the semiconductor-mounted device can have a small heat resistance.

Bumps formed by tearing or cutting off metal threads bonded to the semiconductor chip, bumps formed by plating, and even solder bumps for low pressure mounting can be used as the projecting electrodes 4 of the semiconductor chips 3*a*, 3*b*.

According to the first aspect of the present invention, since the part of the wired board disposed at the position just beneath the projecting electrodes of the second semiconductor chip is supported by the sealing resin, the semiconductor-mounted device can be achieved, in which the application of heat and pressure does not cause any warp, the semiconductor chips can be mounted on any positions of the both sides of the wired board, and any open defect does not occur.

Figure 5:
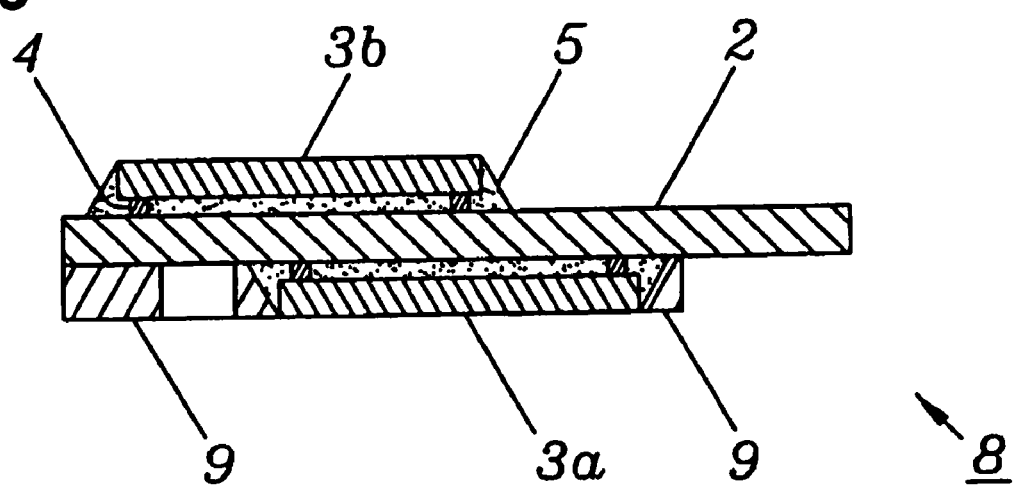
FIG. 5 is a cross sectional view showing an embodiment of a semiconductor-mounted device according to a second aspect of the present invention.

According to a second aspect of the present invention, in a semiconductor-mounted device of an embodiment of the present invention, as shown in FIG. 5, electrode pads (not shown) of a wired board 2 and projecting electrodes 4 of semiconductor chips 3*a*, 3*b* are electrically and mechanically connected on both sides of the wired board 2, the wired board 2 and the semiconductor chips 3*a*, 3*b* being adhered by an underfill resin 5. The semiconductor-mounted device 8 of the present invention comprises a resin sheet 9 which covers, at substantially the same height as the first semiconductor chip, a region disposed around the first semiconductor chip 3*a* mounted on the first side of the wired board and at the position opposite, across the wired board 2, to at least an area of the projecting electrodes 4 of the second semiconductor chip 3*b* mounted on the second side of the wired board, a back surface of the first semiconductor chip being exposed.

Figure 6A:
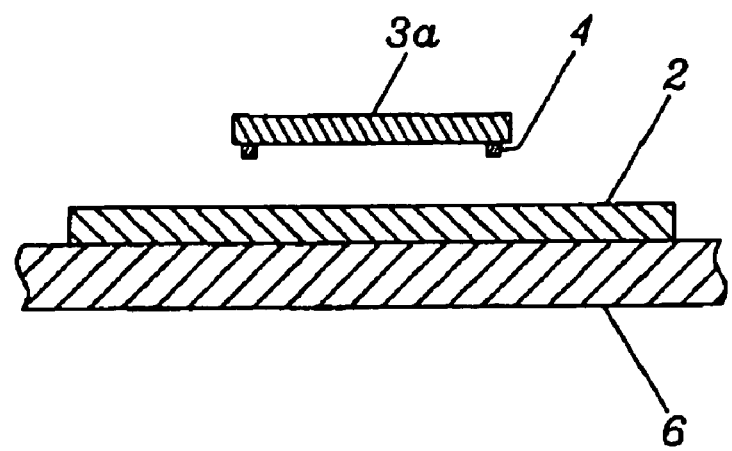
FIGS. 6 ($a$)-($c$) are cross sectional views showing a method for producing a semiconductor-mounted device according to a second aspect of the present invention.
Figure 6B:
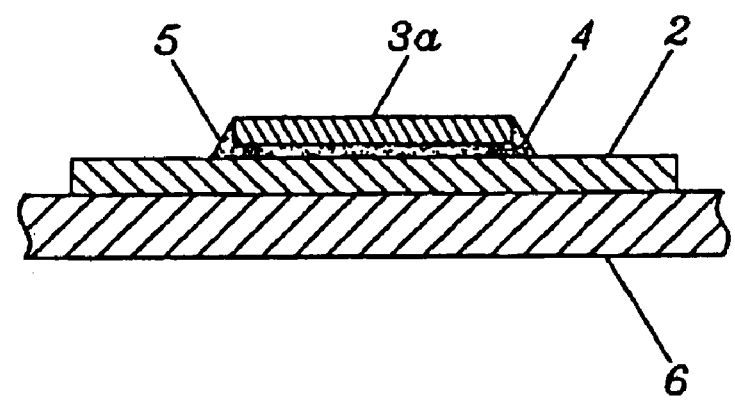
Figure 6C:
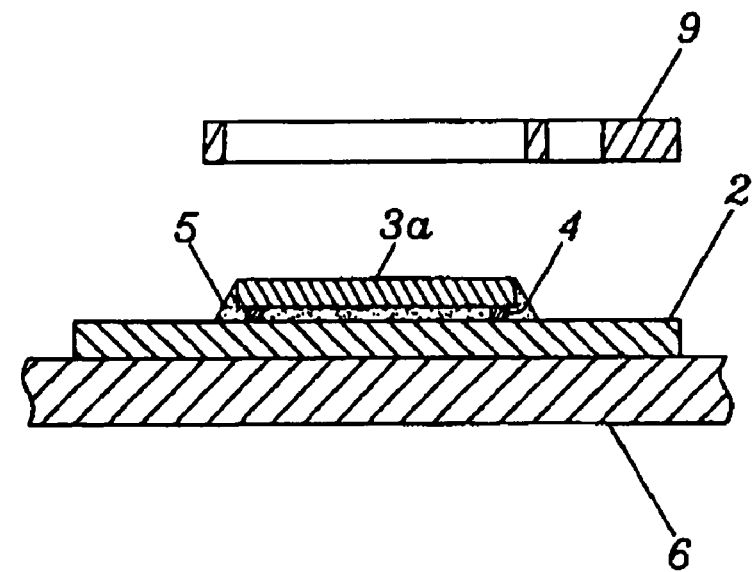
Figure 7A:
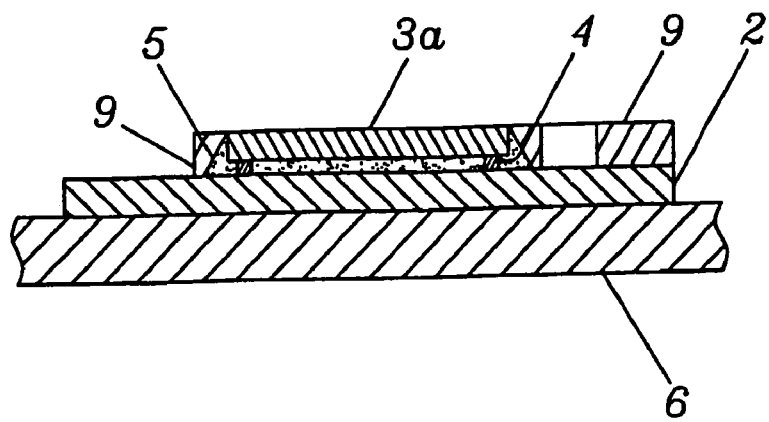
FIGS. 7 ($a$)-($c$) are cross sectional views showing a method for producing a semiconductor-mounted device according to a second aspect of the present invention.
Figure 7B:
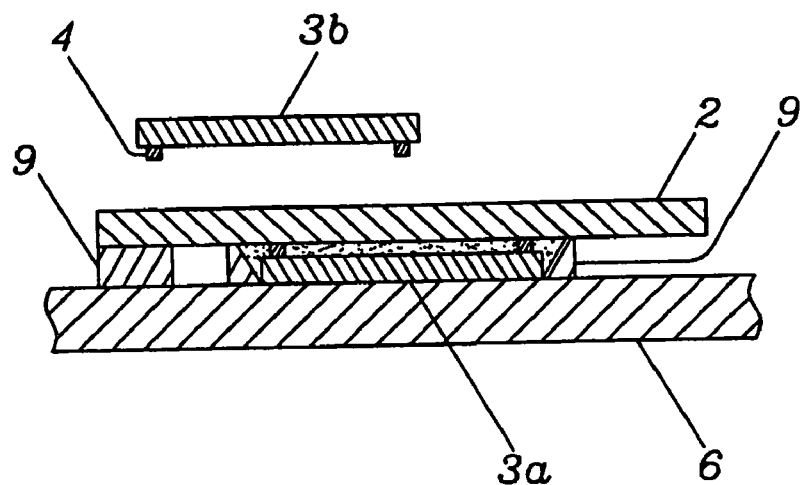
Figure 7C:
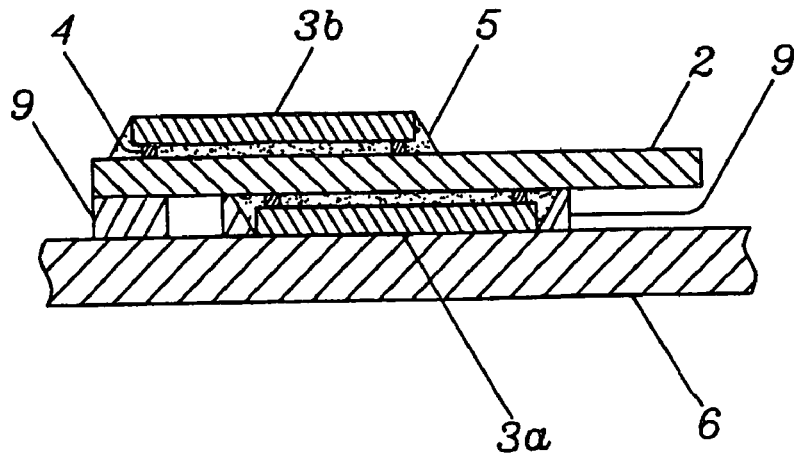

According to the second aspect of the present invention, as shown in FIGS. 6(*a*)-(*b*), a method for producing a semiconductor-mounted device of an embodiment of the present invention may be identical with the method explained via FIGS. 11 (*a*)-(*b*) in the section of BACKGROUND OF THE INVENTION, until the projecting electrodes 4 of the first semiconductor chip 3*a* are put on the electrode pads (not shown) in the first side of the wired board 2 and connected by applying heat and pressure. As shown in FIG. 6(*c*), the method for producing the semiconductor-mounted device of the present invention then comprises the steps of covering a region with the resin sheet 9 at substantially the same height as the first semiconductor chip so as to expose the back surface of the first semiconductor chip, the region being disposed around the first semiconductor chip 3*a* and opposite, across the wired board, to at least the area of the projecting electrodes 4 of the second semiconductor chip 3*b* to be mounted the second side of the wired board. As shown in FIGS. 7(a)-(c), the wired board 2 is then turned over and placed on a stage 6, the second semiconductor chip 3b being mounted on the second side of the wired board 2 by using the known art, the wired board 2 and the second semiconductor chip 3b being adhered by the underfill resin 5.

In this case, the wired board 2 just under the projection electrodes 4 of the second semiconductor chip 3b is supported by the resin sheet 9, so that the application of heat and pressure does not cause any warp, and that the electrode pads of the wired board 2 and the projecting electrodes 4 are securely connected, thereby being freed from any open defect. The sealing resin is not used, thereby not increasing the costs largely. The resin sheet which has any thermal expansion coefficient or hardness may be also used, so the stress of the wired board can be absorbed, thereby not causing any problem of unsatisfactory reliance such as connection defect of the projecting electrodes and cracks or peeling of the sealing resin.

The region covered with the resin sheet at the side of the first semiconductor chip 3a can be modified at any time corresponding to the position at which the second semiconductor chip 3b is mounted, so that the position of the second semiconductor chip 3b can be arbitrarily selected, thereby eliminating a restriction of the constitution of the semiconductor-mounted device.

Figure 8:
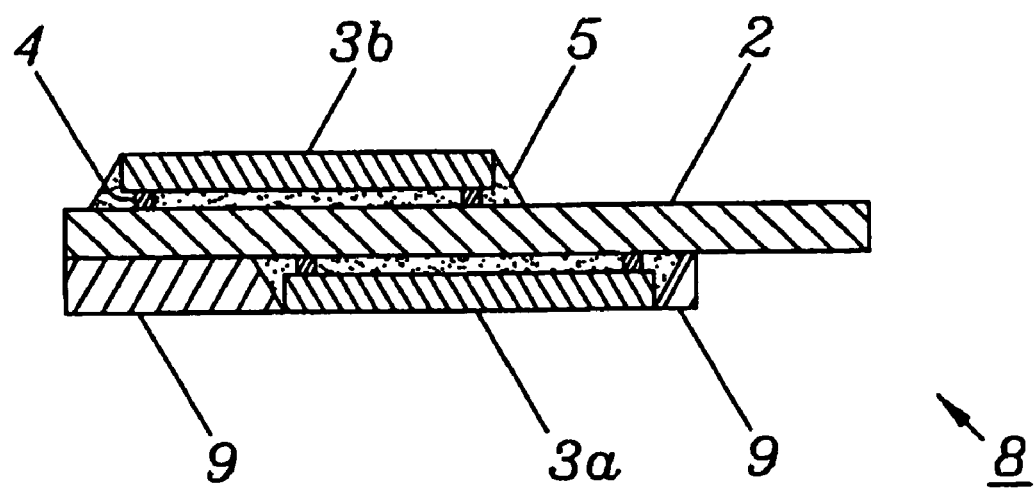
FIG. 8 is a cross sectional view showing another embodiment of a semiconductor-mounted device according to a second aspect of the present invention.

According to another embodiment of the second aspect of the present invention, as shown in FIG. 8, a whole region disposed and extending around the first semiconductor chip 3a lying opposite, across the wired board, to at least the area of the second semiconductor chip 3b mounted the second side of the wired board may be covered with the resin sheet 9.

Figure 9:
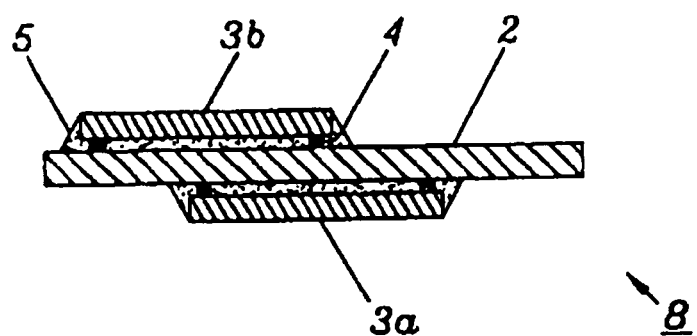
FIG. 9 is a cross sectional view showing a further embodiment of a semiconductor-mounted device according to a second aspect of the present invention.
Figure 10:
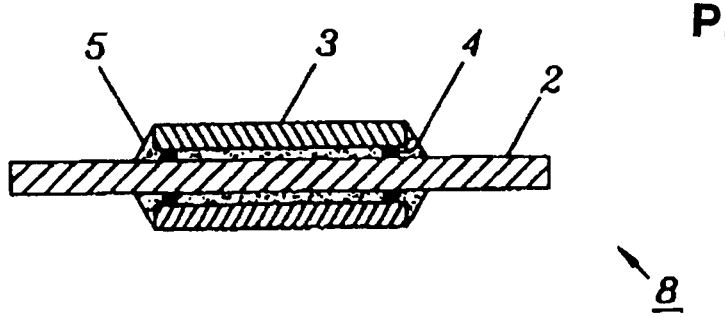
FIG. 10 is a cross sectional view showing an embodiment of a conventional semiconductor-mounted device.

According to further embodiment of the second aspect, the semiconductor-mounted device 8 shown in FIG. 9 can be obtained by mounting the second semiconductor chip 3b shown in FIG. 7(c) and then stripping the resin sheet 9. Therefore, the semiconductor-mounted device can be obtained, which does not have any special interference with other electronic devices and does not largely reduce space of its periphery.

The resin sheet 9 is preferably a thermoplastic resin sheet such as liquid crystal polymer, and may be even a thermosetting resin sheet such as a semi-setting epoxy resin sheet. Even if the resin sheet has no adhesive property itself, the resin sheet may be adhered to the wired board by using an adhesive agent.

Bumps formed by tearing or cutting off metal threads bonded to the semiconductor chip, bumps formed by plating, and even solder bumps for low pressure mounting may be used as the projecting electrodes 4 of the semiconductor chips 3a, 3b.

According to the second aspect of the present invention, the semiconductor-mounted device can be provided, in which the positions at which the semiconductor chips are mounted are different between from one side to the other side of the wired board, the semiconductor-mounted device not increasing the costs largely as compared with the method using the resin seal, not causing the problems of reliance such as the connection defect of the projecting electrodes and the cracks or peeling of the sealing resin, and not reducing the space around the semiconductor-mounted device largely.

A semiconductor-mounted device of the present invention and a producing method thereof are not restricted to the above embodiments. If electronic devices may be mounted on a wired board with both sides, various modifications can be added within a scope which does not depart from the purport of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor-mounted device, comprising:
   a wired board;
   a first semiconductor chip mounted on a first side of said wired board;
   a second semiconductor chip mounted on an opposing second side of said wired board, said second semiconductor chip being offset from said first semiconductor chip; and
   a support supporting said wired board and being disposed on the first side of said wired board, said support preventing said wired board from warping when said second semiconductor chip is mounted on the wired board.

2. The semiconductor-mounted device as defined in claim 1, wherein one of said first and second semiconductor chips has a sealing applied to a surface thereof.

3. A semiconductor-mounted device, comprising:
   a wired board;
   a first semiconductor chip mounted on a first side of said wired board;
   a second semiconductor chip mounted on an opposing second side of said wired board; and
   a support supporting said wired board and being disposed on the first side of said wired board, said support preventing said wired board from warping when said second semiconductor chip is mounted on the wired board,
   wherein said support is formed from a same material as a sealing applied to at least one of said first and second semiconductor chips.

4. The semiconductor-mounted device as defined in claim 3, wherein said support has a same height as the first semiconductor chip.

5. The semiconductor-mounted device as defined in claim 3, wherein said support is disposed remote from a sealing applied to said first semiconductor chip.

6. The semiconductor-mounted device as defined in claim 3, wherein said support is disposed continuous with a sealing applied to said first semiconductor chip.

7. The semiconductor-mounted device as defined in claim 3, wherein one of said first and second semiconductor chips has an exposed surface.

8. The semiconductor-mounted device as defined in claim 6, wherein said support extends further beyond a first edge of said first semiconductor chip than said sealing extends beyond a second edge of said first semiconductor chip.

9. A semiconductor-mounted device, comprising:
   a wired board;
   a first semiconductor chip mounted on a first side of said wired board;
   a second semiconductor chip mounted on an opposing second side of said wired board; and
   a support supporting said wired board and being disposed on the first side of said wired board, said support preventing said wired board from warping when said second semiconductor chip is mounted on the wired board, wherein a sealing resin sealing said first semiconductor chip has a same height as said first semiconductor chip, and wherein a back surface of said first semiconductor chip is exposed through said sealing resin.

10. The semiconductor-mounted device as defined in claim 9, wherein said support is disposed remote from a sealing applied to said first semiconductor chip.

11. The semiconductor-mounted device as defined in claim 9, wherein said support is disposed continuous with a sealing applied to said first semiconductor chip.

12. The semiconductor-mounted device as defined in claim 11, wherein said support extends further beyond a first edge of said first semiconductor chip than said sealing extends beyond a second edge of said first semiconductor chip.

13. The semiconductor-mounted device as defined in claim 9, wherein said second semiconductor chip has a sealing applied to a surface thereof.

14. A semiconductor-mounted device, comprising:
a wired board;
a first semiconductor chip mounted on a first side of said wired board;
a second semiconductor chip mounted on an opposing second side of said wired board; and
a support supporting said wired board and being disposed on the first side of said wired board, said support preventing said wired board from warping when said second semiconductor chip is mounted on the wired board,
wherein said support is formed of a resin sheet.

15. The semiconductor-mounted device as defined in claim 14, wherein said support has a same height as the first semiconductor chip.

16. The semiconductor-mounted device as defined in claim 14, wherein said support is disposed remote from a sealing applied to said first semiconductor chip.

17. The semiconductor-mounted device as defined in claim 14, wherein said support is disposed continuous with a sealing applied to said first semiconductor chip.

18. The semiconductor-mounted device as defined in claim 17, wherein said support extends further beyond a first edge of said first semiconductor chip than said sealing extends beyond a second edge of said first semiconductor chip.

19. The semiconductor-mounted device as defined in claim 14, wherein one of said first and second semiconductor chips has a sealing applied to a surface thereof.

20. The semiconductor-mounted device as defined in claim 14, wherein one of said first and second semiconductor chips has an exposed surface.

21. A semiconductor-mounted device, comprising:
a wired board;
a first semiconductor chip mounted on a first side of said wired board;
a second semiconductor chip mounted on an opposing second side of said wired board; and
a support supporting said wired board and being disposed on the first side of said wired board, said support preventing said wired board from warping when said second semiconductor chip is mounted on the wired board,
wherein at least part of said support is disposed in a region where a mounting area of said second semiconductor chip extends beyond that of said first semiconductor chip.

22. The semiconductor-mounted device as defined in claim 21, wherein said support has a same height as the first semiconductor chip.

23. The semiconductor-mounted device as defined in claim 21, wherein said support is disposed continuous with a sealing applied to said first semiconductor chip.

24. The semiconductor-mounted device as defined in claim 23, wherein said support extends further beyond a first edge of said first semiconductor chip than said sealing extends beyond a second edge of said first semiconductor chip.

25. The semiconductor-mounted device as defined in claim 21, wherein one of said first and second semiconductor chips has a sealing applied to a surface thereof.

26. A semiconductor-mounted device, comprising:
a wired board;
a first semiconductor chip mounted on a first side of said wired board;
a second semiconductor chip mounted on an opposing second side of said wired board; and
a support supporting said wired board and being disposed on the first side of said wired board, said support preventing said wired board from warping when said second semiconductor chip is mounted on the wired board,
wherein at least part of said support is disposed in an area lying opposite to an area of projecting electrodes of said second semiconductor chip.

27. The semiconductor-mounted device as defined in claim 26, wherein said support has a same height as the first semiconductor chip.

28. The semiconductor-mounted device as defined in claim 26, wherein said support is disposed remote from a sealing applied to said first semiconductor chip.

29. The semiconductor-mounted device as defined in claim 26, wherein said support is disposed continuous with a sealing applied to said first semiconductor chip.

30. The semiconductor-mounted device as defined in claim 29, wherein said support extends further beyond a first edge of said first semiconductor chip than said sealing extends beyond a second edge of said first semiconductor chip.

31. The semiconductor-mounted device as defined in claim 26, wherein one of said first and second semiconductor chips has a sealing applied to a surface thereof.

32. The semiconductor-mounted device as defined in claim 26, wherein one of said first and second semiconductor chips has an exposed surface.

33. A semiconductor-mounted device, comprising:
a wired board;
a first semiconductor chip mounted on a first side of said wired board;
a second semiconductor chip mounted on an opposing second side of said wired board; and
a support supporting said wired board and being disposed on the first side of said wired board, said support extending from a first edge of said first semiconductor chip to a second edge of said second semiconductor chip,
wherein said first edge is disposed in a mounting area of said second semiconductor chip.

34. The device as claimed in claim 33, wherein said first semiconductor chip has a third edge opposing to said first edge, said support being absent from said third edge.

* * * * *